United States Patent
Chu et al.

(10) Patent No.: US 10,087,069 B2
(45) Date of Patent: Oct. 2, 2018

(54) SEMICONDUCTOR DEVICES WITH MOVING MEMBERS AND METHODS FOR MAKING THE SAME

(71) Applicant: Taiwan Semiconductor Manufacturing Company, Ltd., Hsin-Chu (TW)

(72) Inventors: Chia-Hua Chu, Zhubei (TW); Kuei-Sung Chang, Kaohsiung (TW); Chung-Hsien Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 32 days.

(21) Appl. No.: 15/441,791

(22) Filed: Feb. 24, 2017

(65) Prior Publication Data

US 2017/0166435 A1   Jun. 15, 2017

Related U.S. Application Data

(62) Division of application No. 13/157,994, filed on Jun. 10, 2011, now Pat. No. 9,586,811.

(51) Int. Cl.
*B81B 3/00* (2006.01)
*B81B 7/00* (2006.01)
*B81C 1/00* (2006.01)

(52) U.S. Cl.
CPC ............ *B81B 3/0005* (2013.01); *B81B 3/001* (2013.01); *B81B 7/007* (2013.01);
(Continued)

(58) Field of Classification Search
CPC .................................................. B81B 3/0005
(Continued)

(56) References Cited

U.S. PATENT DOCUMENTS

2002/0024076 A1* 2/2002 Nakabayashi .... H01L 27/10894
257/296
2003/0001251 A1* 1/2003 Cheever ................ B81B 7/0006
257/685

(Continued)

FOREIGN PATENT DOCUMENTS

JP         2004255562         9/2004

OTHER PUBLICATIONS

Chia-Pao Shu and Chla-Hua Chu, U.S. Appl. No. 13/006,239, filed Jan. 13, 2011, for "Bulk Silicon Moving Member With Dimple," 17 pages of text, 14 pages of drawings.

*Primary Examiner* — Ajay K Arora
(74) *Attorney, Agent, or Firm* — Haynes and Boone, LLP

(57) ABSTRACT

A method for forming a MEMS structure includes forming, on a MEMS substrate, an interconnect structure having conductive lines and a first conductive plug of a semiconductor material, forming an etch stop layer on the interconnect structure, forming a dielectric layer over the etch stop layer, bonding a silicon substrate over the dielectric layer, forming a second and third conductive plugs of the semiconductor material in the silicon substrate, wherein the second conductive plug is configured to be electrically coupled with the first conductive plug and third conductive plug is configured to function as an anti-stiction bump, forming a MEMS device electrically coupled with the second conductive feature, and forming a bonding pad on the silicon substrate and surrounded by the second conductive plug.

20 Claims, 5 Drawing Sheets

(52) U.S. Cl.
CPC ...... *B81C 1/00269* (2013.01); *B81C 1/00579* (2013.01); *B81B 2201/0235* (2013.01); *B81B 2201/0242* (2013.01); *B81B 2207/012* (2013.01); *B81B 2207/07* (2013.01); *B81B 2207/092* (2013.01); *B81B 2207/095* (2013.01); *B81B 2207/096* (2013.01); *B81C 2201/014* (2013.01); *B81C 2201/0111* (2013.01); *B81C 2201/0176* (2013.01); *B81C 2203/019* (2013.01); *B81C 2203/0118* (2013.01)

(58) Field of Classification Search
USPC .......................................... 438/52; 257/692
See application file for complete search history.

(56) References Cited

U.S. PATENT DOCUMENTS

| | | |
|---|---|---|
| 2003/0054584 A1 | 3/2003 | Hinzel et al. |
| 2003/0232252 A1 | 12/2003 | Mancini et al. |
| 2004/0104444 A1 | 6/2004 | Wachtmann et al. |
| 2006/0071324 A1 | 4/2006 | Lu et al. |
| 2006/0234413 A1 | 10/2006 | Chilcott |
| 2007/0222007 A1* | 9/2007 | Van Beek ............ B81B 3/0078 257/415 |
| 2009/0243004 A1 | 10/2009 | Lan et al. |
| 2010/0301432 A1 | 12/2010 | Kittisland et al. |
| 2012/0001277 A1* | 1/2012 | Park .................. B81C 1/00182 257/418 |

* cited by examiner

SEMICONDUCTOR DEVICES WITH MOVING MEMBERS AND METHODS FOR MAKING THE SAME

PRIORITY INFORMATION

This application is a divisional of U.S. patent application Ser. No. 13/157,994 filed Jun. 10, 2011, and entitled "Semiconductor Devices with Moving Members and Methods for Making the Same," the disclosure of which is hereby incorporated by reference in the entirety.

BACKGROUND

The present disclosure relates generally to semiconductor manufacturing. Specifically, the present disclosure relates to devices with moving members and methods of making the same.

Micro-electro-mechanical systems (MEMS) devices include very small electro-mechanical systems incorporated into semiconductor IC circuits. Some MEMS devices have moving members separated from the substrate by a cavity and one or more bumps. The bumps may be on top of the substrate or on the moving members. The purpose of the bumps is to constrain the range of motion of the moving members, preventing the moving members from touching the substrate or layers directly on top of the substrate. When some materials, such as oxides, are used for bumps, the oxide bump can cause dielectric charging issue. Additionally, the resulting device with oxide bump may experience parasitic capacitance and stiction. Parasitic capacitance and stiction may make the resultant device ineffective in sensing some movement.

Some conventional techniques for forming the cavity include depositing a sacrificial oxide layer over the substrate. The sacrificial oxide layer is then patterned and etched away using vapor Hydrogen Fluoride (HF) as an etchant to create a cavity. Other conventional techniques may use plasma dry etching or chemical wet etching. A silicon wafer is then fusion bonded onto the etched sacrificial oxide layer. Moving members are created using the fusion bonded silicon wafer, and the cavity provides space for motion of the moving member. However, this conventional technique can be less than optimal in some circumstances. For instance, the fusion bond between the silicon wafer and the oxide layer may be undesirably weak if the silicon wafer is deposited after the oxide layer is etched.

As another example, one conventional process forms the sacrificial layer without planarization. Unevenness in the sacrificial oxide layer then creates step shapes in the cross section of the silicon layer that is formed on top of the sacrificial layer. These step shapes generally provide a poor mechanical boundary and can result in low yield.

In another example, the sacrificial oxide layer is formed and planarized. However, it can be difficult to control the dimension of the cavity as it is formed during HF etching. Therefore, what is needed is an improved MEMS device and method for making the same.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

In FIGS. 1A-C and 2A and B, the respective methods are illustrated using a series of cross-sections of the MEMS devices during steps of fabrication.

DETAILED DESCRIPTION

Figure 1A:
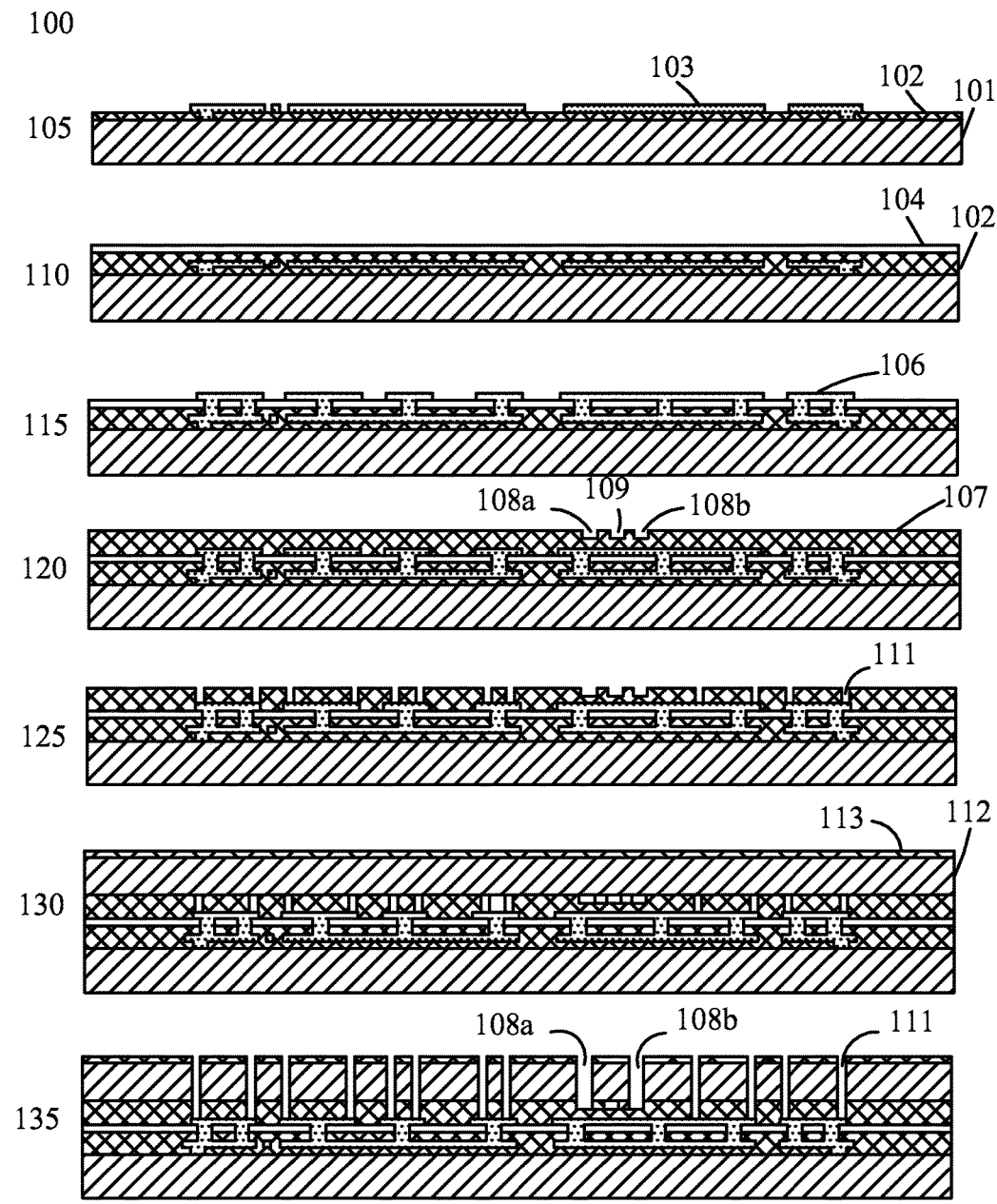
FIGS. 1A-C illustrate an exemplary method for fabricating a MEMS device package according to one embodiment.

The present disclosure relates generally to semiconductor manufacturing. Specifically, the present disclosure relates to devices with moving members and methods of making the same.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer includes embodiments where the first and second layer are in direct contact and those where one or more layers are interposing the first and second layer. The present disclosure refers to MEMS devices; however, one of ordinary skill in the art will find other applicable technologies that may benefit from the disclosure, such as nanoelectromechanical systems (NEMS) devices. Furthermore, the MEMS device structure or design illustrated is exemplary only and not intended to be limiting in any manner.

The process of FIGS. 1A-C and 2A and B are wafer-level processes, where one of the cells of the wafers is shown in cross-section for ease of illustration. It is understood that the same processes are applied to other cells of the structure to create similar MEMS device packages.

Figure 1B:
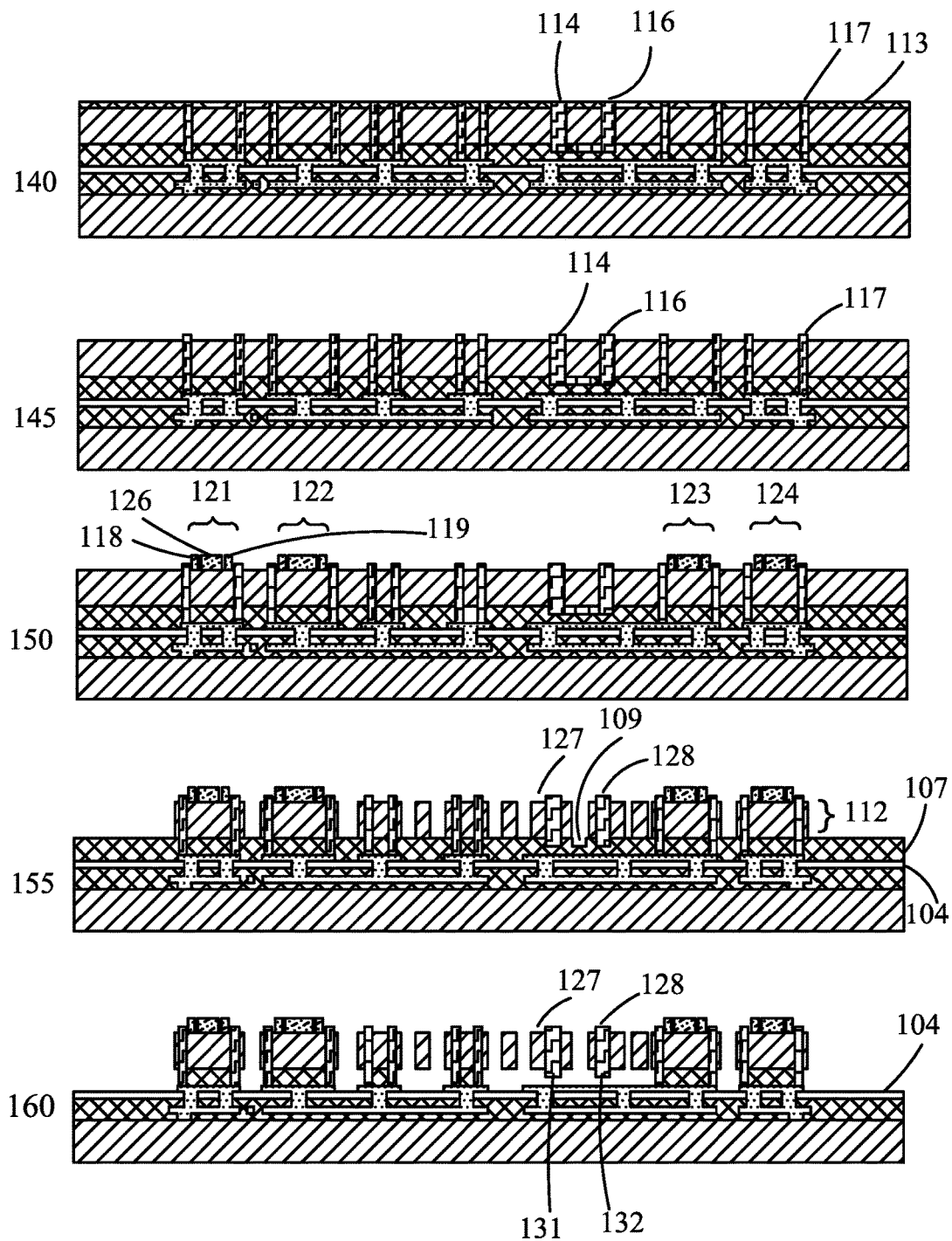
Figure 1C:
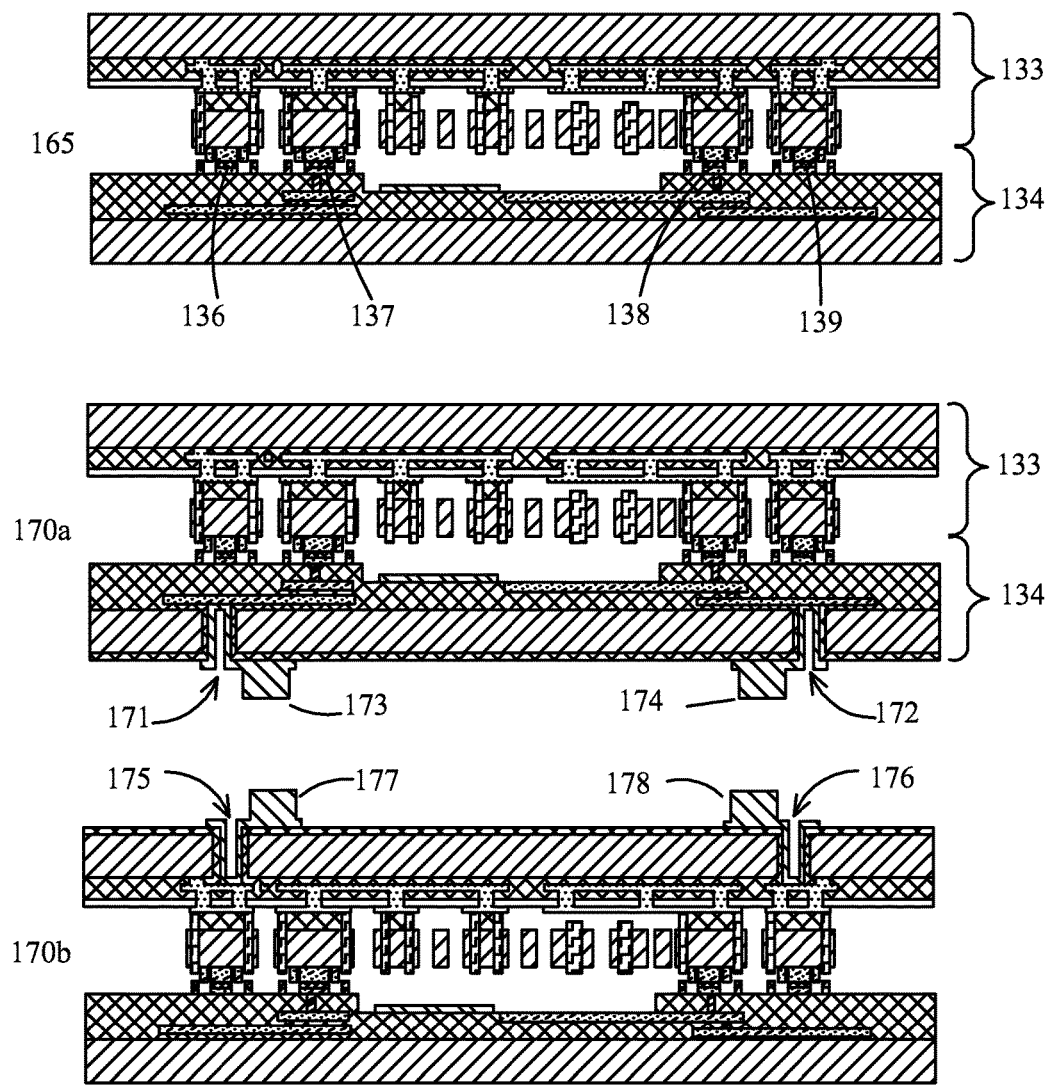

FIGS. 1A-C are illustrations of exemplary method 100 for making a semiconductor MEMS device. Each process in method 100 is represented with a cross-section of the semiconductor device during a given step in manufacturing, and the method is depicted as a series of the processes. MEMS devices made by method 100 can be used in any of a variety of MEMS-based applications, such as accelerometers and other motion-detecting sensors. The semiconductor structure shown in processes 105-160 is referred to herein as a MEMS wafer. In subsequent steps, it is packaged using a caps wafer (FIG. 1C).

Method 100 begins at process 105, which shows silicon substrate 101. Dielectric layer 102 is deposited on substrate 101 and patterned. One example embodiment includes Chemical Vapor Deposition (CVD) of $SiO_2$, though other deposition processes can be used as well. Also, it is contemplated that other types of dielectric layers may be used. Oxide layers (such as layer 102) may be formed on the substrate 101 by bonding, depositing, thermally oxidizing, CVD, or other methods known in the art for forming dielectric layers on a substrate. Photolithography processes and etch can be used to pattern dielectric layer 102 (or oxide layer 102), defining various openings in the oxide layer 102 such that the substrate 101 is exposed within the openings.

Then, polysilicon layer 103 is deposited and patterned on dielectric layer 102 using, e.g., CVD. Patterning may include, e.g., photolithography and etch. Polysilicon layer 103 is doped with proper conductivity and is used as a signal routing layer, as explained further below. The polysilicon layer 103 is formed on the substrate 101 within the openings of the oxide layer 102 and further formed on the oxide layer 102. The patterned polysilicon layer 103 constitutes a portion of an interconnect structure including one or more polysilicon plugs in the openings of the oxide layer 102 and polysilicon lines on the oxide layer 102.

Substrate 101 is shown as silicon, though the scope of embodiments is not limited to silicon. For instance, other embodiments may use different substrate materials, such as glass, GaAs, high resistive silicon, low resistive silicon, and the like. Similarly, the polysilicon layer 103 can be replaced by a layer of other conductive material able to withstand high temperatures, such as SiGe, WSi, Au, or Ti in other embodiments. The dielectric layer 102 can include oxide, SiN, and the like.

In process 110, the oxide layer 102 is built up to cover polysilicon layer 103, and an etch stop layer 104 is deposited thereon. In some embodiments, a planarization technique (e.g., chemical mechanical polishing) is performed on layer 102 before etch stop layer 104 is formed. The etch stop layer 104 includes a material resistant to the etchant used to etch the oxide layer 102 or other corresponding dielectric material if alternatively used for the dielectric layer 102. One example etchant to etch the oxide layer 102 includes hydrofluoric acid (HF). An example etch stop material that is a dielectric material resistant to the etchant (e.g., HF) to etch the oxide layer 102, such as aluminum nitride (AlN), though other materials, such as AlN, SiC, low stress SiN, and $Al_2O_3$, can be used in different embodiments. In one example, AN is deposited by sputtering on oxide layer 102.

In process 115, layers 102, 104 are etched to define via formation, then polysilicon layer 106 is deposited and patterned. Photo-resists are not shown in FIG. 1A, though it is understood that photo-resists can be used to create patterns in layers 102, 104, 106 by allowing other parts of the layers 102, 104, 106 to be removed by an etching process. As shown in process 115, polysilicon layer 106 is patterned to includes polysilicon plugs in vias and polysilicon lines on the etch stop layer 104, and is electrically coupled to polysilicon layer 103 thereby creating two signal routing layers. Although two polysilicon interconnect layers are illustrated, the interconnect structure may include more polysilicon layers if necessary.

In process 120, a dielectric layer 107 is formed and planarized using, e.g., Chemical Mechanical Polishing (CMP). In the present embodiment, the dielectric layer 107 includes silicon oxide that is significantly etched away in process 160 to create a cavity and expose moveable members. Further in process 120, dielectric layer 107 (or oxide layer 107) is partially etched to form releasing trench 109 (explained further below) and anti-stiction bump areas 108 (also explained further below). In process 125, oxide layer 107 is further patterned to define via areas typified by via area 111.

In process 130, silicon wafer 112 is fusion bonded to oxide layer 107. In one example, fusion bonding is fulfilled by commercial bonder. The fusion bonder applies the plasma treatment on the wafers, then aligns the two wafers and applies force to bond the two wafers. After or during the fusion bonding process, there may be an anneal process to increase the bonding strength. In the present embodiment, the fusion bonding is achieved between the silicon of the silicon wafer and the silicon oxide of the oxide layer 107. Alternatively, other substrate of a suitable material may be used to be bonded with the dielectric layer 107. In some examples, silicon wafer 112 is then thinned down as appropriate. Another dielectric layer 113, such as silicon oxide, is formed on the silicon wafer 112. The dielectric layer 113 includes a proper thickness that defines the height of the anti-stiction bumps (explained further below). Of note in process 130 is that silicon wafer 112 is fusion bonded to oxide layer 107 before oxide layer 107 is etched away to form a cavity for the MEMS device (shown at process 160). Such characteristic increases the quality of the fusion bond between layers 112 and 107. By contrast, embodiments that fusion bond a silicon wafer over a pre-formed cavity may suffer from low-quality fusion bonding and low yields.

In process 135, layers 112, 113 are etched through to further define the via areas (e.g., via area 111) and bump areas 108. The via areas 111 and bump areas 108 (respectively) are filled with polysilicon in subsequent actions to electrically connect the multiple layers of the interconnect structure and to form anti-stiction bumps.

In process 140, a polysilicon deposition is implemented to fill via areas 111 and bump areas 108. Via areas 111 are filled by polysilicon deposition to form polysilicon plugs 117. Plugs 117 are designed for electrical routing and are also referred to as vias 117. Bump areas 108 are filled by polysilicon deposition to form polysilicon plugs 114 and 116. Plugs 114 and 116 are used as anti-stiction bumps as shown in process 160 and are also referred to as anti-stiction bumps 114 and 116. In one example, the polysilicon is deposited using Low Pressure Chemical Vapor Deposition (LPCVD). Additionally, in process 140, the surface of the polysilicon is etched or polished back to the surface of layer 113, such as by a CMP process. The embodiments are not limited to polysilicon only, as other suitable materials may be used instead. In various embodiments, vias 117 and bumps 114, 116 can be filled by polysilicon, SiGe, and/or other suitable materials, such as a conductive material that are resistant to the etchant (e.g., vapor HF) that etches the dielectric layers (e.g., dielectric layer 107). It is also preferred the material can be conformally deposited to form the vias 117 and bumps 114, 116. In some embodiments, metal plating can also be used to form via 117 and bumps 114, 116. Other candidates for use in vias 117 and bumps 114, 116 include, e.g., tungsten (W), titanium nitride (TiN), copper (Cu), gold (Au), titanium (Ti), and nickel (Ni).

In process 145, oxide layer 113 is removed, leaving top portions of the polysilicon vias and bumps exposed. The top portions of the polysilicon vias and bumps are defined by the thickness of the dielectric layer 113. The bumps 114 and 116 function for anti-stiction during operation of the MEMS device. Furthermore, the vias 117 function for electrical routing. According to various embodiments of the present disclosure, since those anti-stiction features are conductive, the charging issue is eliminated. Additionally, the polysilicon plugs (such as 117) also serve to stop etch during subsequent etch process to form the MEMS device. Particularly, the etch stop layer 104 stops etch in the vertical direction (the direction perpendicular to the substrate 101) and the polysilicon plugs 117 stop etch in the horizontal (or lateral) direction.

In process 150, a metal layer is deposited and patterned to form metal features 121-124. The material of the metal features 121-124 is conductive and able to perform wafer bonding, such as eutectic bonding, with the caps wafer (or cap substrate) of FIG. 1C. For instance, the metal features 121-124 may be formed from tungsten, aluminum, copper, nickel, other suitable metal, or other suitable conductive material, such as doped germanium. Other bonding technique, such as diffusion bonding or fusion bonding, may be alternatively implemented. The metal features 121-124 may be formed using deposition (e.g., physical vapor deposition), patterning (such as lithography and etching) and/or any other methods now known or later developed.

The metal features 121-124 are patterned for bonding and electrical routing. Additionally, the metal features 121-124 are patterned to further prevent squish issue during the bonding process. Using the metal feature 121 as an example, the metal feature 121 includes an inside portion 126 and edge portions 118 and 119 surrounding the inside portion 126. The inside portion 126 is configured for eutectic bonding. Specifically, in further steps, a caps wafer (FIG. 1C) can be placed over the MEMS wafer, where the caps wafer includes a metal selected to eutectically bond with the metal portion 126. The eutectic bonding bonds the caps wafer and the MEMS wafer together. Eutectic bonding involves melting the metal portion 126, so metal portions 118, 119 are provided to constrain the melted portion 126 during the bonding process. The caps wafer may also include metal portions that correspond to metal portions 118, 119 to constrain the eutectic metal.

Additionally, the top portion of the polysilicon plugs 111 surrounding the metal features 121-124 also function to constrain the melted metal during the bonding process (e.g., eutectic bonding) such that they prevent the melted metal from spilling out.

The metal features 121-124 are shown in cross-section in FIG. 1B. In a top-down view, the metal features 121-124 may form two concentric rings in some embodiments. Additionally, the metal features 121-124 act as electrical contacts with the polysilicon interconnects in layers 103, 106. In the finished MEMS device, the polysilicon of layers 103, 106 carry electrical signals within the MEMS device, and such electrical signals are accessible through the contacts formed by the metal features 121-124.

Processes 155 and 160 show steps to finish the MEMS wafer. In process 155, silicon layer 112 is etched to form the MEMS structure. Note moveable members 127, 128 that are formed by the etching in process 155. Additionally, release trench 109 is exposed as well.

In process 160, vapor HF is used to remove portions of oxide layer 107. Specifically, the vapor HF comes in contact with oxide layer 107 through release trench 109, thereby etching underneath silicon layer 112 to expose moveable members 127, 128.

During the etching process, layer 104 acts an etch stop layer in the y-axis direction (vertical direction), thereby constraining the depth of the cavity between silicon layer 112 and substrate 101. Also, the polysilicon vias 117 formed at process 140 act as etch stops in the x-axis (horizontal direction), thereby constraining the width of the cavity. In one aspect, the polysilicon vias do double duty, both as signal carrying structures and as etch stop structures. Further in this embodiment, moveable members 127, 128 include polysilicon anti-stiction bumps 131, 132. In contrast to oxide bumps of conventional MEMS devices, anti-stiction bumps 131, 132 are conductive and do not experience significant charge build-up.

Method 100 continues at FIG. 1C. In FIG. 1C at process 165, MEMS wafer 133 is eutectically bonded to caps wafer 134. In one embodiment, caps wafer 134 is a semiconductor wafer, such as a silicon wafer, having various integrated circuit (such as MEMS driving circuit) formed thereon. In one example, caps wafer 134 includes various CMOS transistors and may further includes other active and passive devices. Caps wafer 134 may further include interconnect structure, such as metal lines, metal contacts and metal vias. In one example, the interconnect structure of the caps wafer 134 includes tungsten plugs and copper (or aluminum) metal lines. Caps wafer 134 is not limited to a CMOS wafer. Caps wafer 134 can be a CMOS wafer, another MEMS wafer, an interposer wafer, or a pure structure wafer for capping or packaging in some embodiments. Caps wafer 134 also includes metal trace configured to be aligned with metal features 121-124 for wafer bonding. In the present embodiment, caps wafer 134 includes metal features 136-139.

MEMS wafer 133 can be placed over caps wafer 134 so that the metal features 136-139 of caps wafer 134 are aligned with and contact the metal features 121-124 of MEMS wafer 133 and forms eutectic bonds (a heating step may be included at process 165 to facilitate the eutectic bonding). The cell shown as a combination of MEMS wafer 133 and caps wafer 134 in this view is a MEMS device package. In some embodiments, the MEMS device package is a Wafer-Level Chip Scale Package (WLCSP), though other embodiments may employ different packaging techniques. In subsequent steps, dicing may be performed to form the MEMS device packages at wafer-level.

The cross-sections at processes 170a and 170b show different ways to create signal contacts on the outside of the package. In process 170a, through substrate vias (or through silicon vias or TSVs) 171 and 172 are formed in caps wafer 134 by etching and metal deposition to provide electrical communication to the MEMS devices through the interconnect structure of caps wafer 134, bonding structures between MEMS and caps wafers, and polysilicon plugs of MEMS wafer 133. Metal pads 173 and 174 are formed on the backside of caps wafer 134 and are further connected to the TSVs 171 and 172 to provide communication to outside of the package. In one example, the metal pads 173 and 174 are solder bumps.

In alternative embodiment illustrated in process 170b, similar TSVs and metal pads are formed on the MEMS wafer 133. Particularly, TSVs 175 and 176 are formed in MEMS wafer 133 by etching and metal deposition to provide electrical communication to the MEMS devices through various polysilicon plugs of MEMS wafer 133. Metal pads 177 and 178 are formed on the backside of MEMS wafer 133 and are further connected to the TSVs 175 and 176 to provide communication to outside of the package. In one example, the metal pads 177 and 178 are solder bumps.

In another embodiment, before bonding MEMS wafer 133 and caps wafer 134, anti-stiction coating layers, such as self-assembled monolayer coating, are formed on both surfaces of MEMS wafer 133 and caps wafer 134 to prevent stiction during operations of the MEMS device.

The TSVs 171-172 (or 175-176) and the metal pads 173 and 174 (or 177 and 178) of FIG. 1C provide outside electrical communication with the signals inside the MEMS device package. Thus, signals carried on the interconnect layers fashioned from polysilicon layers 103, 106 can be input or output using corresponding TSVs and metal pads. TSVs are only one way to make electrical contacts to the package.

In other embodiments, bond wire pads may be used. For instance, the embodiments shown in FIGS. 2A-B utilize a grinding process to expose bond pad areas for connection outside of the package. It is understood that the similar types of process including deposition and etching applied in FIGS. 1A-C may be applied in the processes of FIGS. 2A-B.

Furthermore, similar types of structures, such as polysilicon structure are formed on the MEMS wafer for electrical routing, anti-stiction and bonding protection, and further to prevent from the charging issue.

Figure 2A:
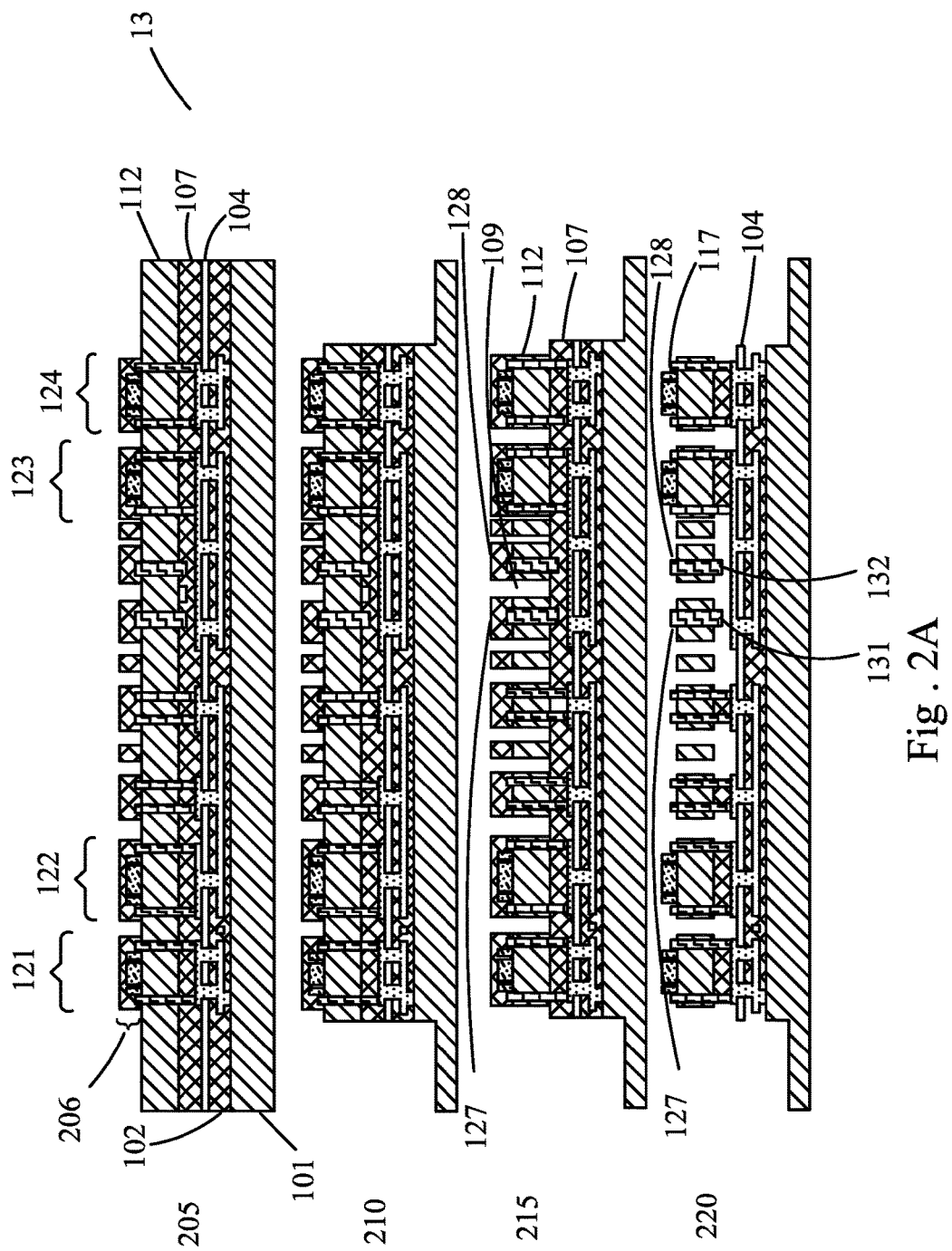
FIGS. 2A and B illustrate another exemplary method for fabricating a MEMS device package according to one embodiment.
Figure 2B:
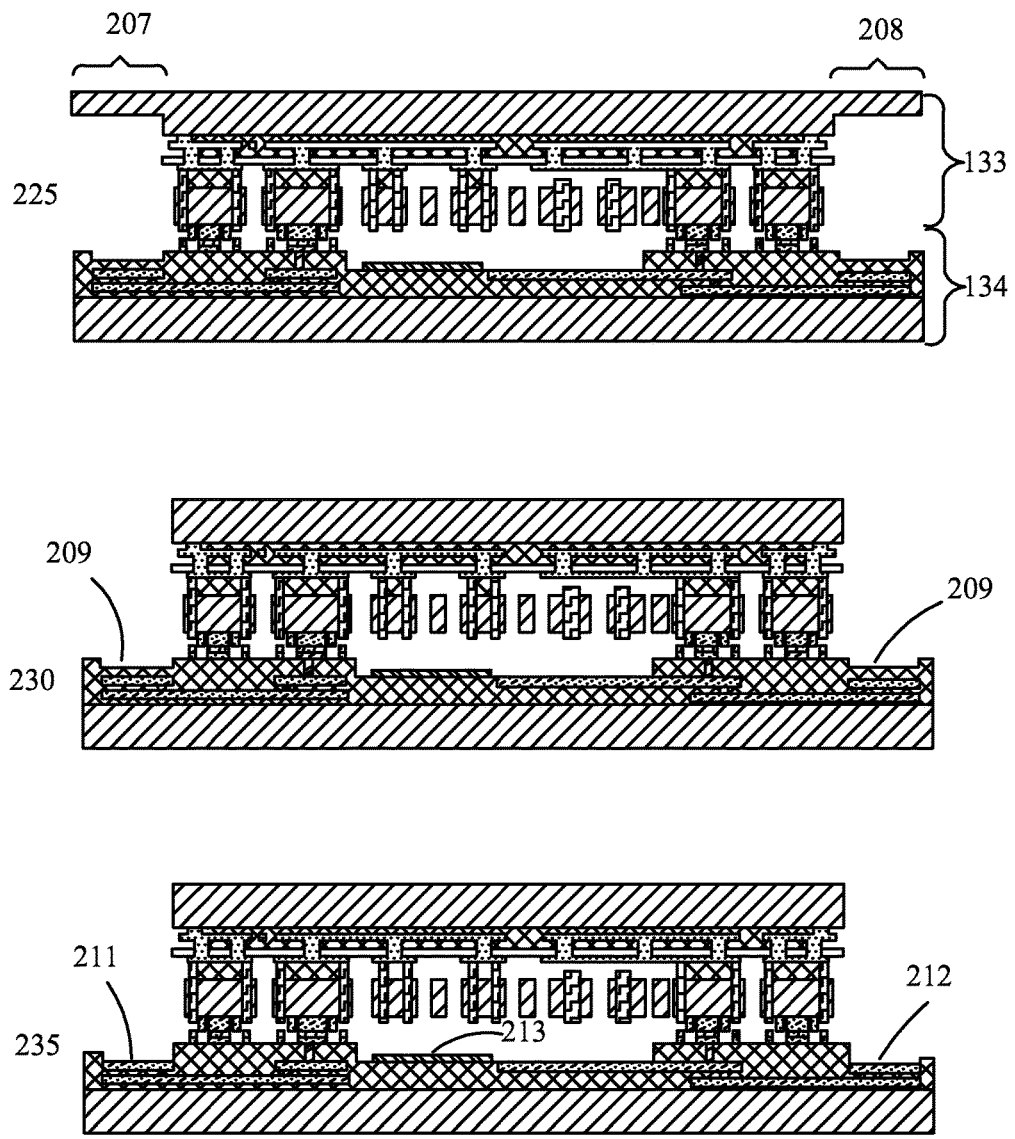

FIGS. 2A-B illustrate exemplary method 200 for fabricating a MEMS device according to one embodiment. FIG. 2A begins with process 205, which follows process 150 of FIG. 1B.

In process 205, a dielectric layer 206, such as oxide layer, is deposited and then patterned to cover metal features 121-124 as well as exposed portions of polysilicon plugs. The dielectric layer 206 is used as a mask during the etching actions of process 215. In process 210, etching is performed to remove parts of silicon layers 101, 112, dielectric layers 102, 107, and etch stop layer 104 at the edges of the cells of MEMS wafer 133.

In process 215, silicon wafer 112 is etched using dielectric layer 206 as a hard mask for patterning. Similar to process 155 of FIG. 1B, the etching creates moveable members 127, 128 and exposes release trench 109. In process 220, vapor HF etching is performed to remove a portion of layer 107. Etch stop layer 104 and polysilicon vias (e.g., via 117) act as y-axis and x-axis boundaries for the etching. Once again, it is worth noting that the cavity is formed after silicon wafer 112 is fusion bonded to layer 107.

FIG. 2B illustrates exemplary packaging steps to follow process 220 of FIG. 2A. Process 225 of FIG. 2B is similar to process 165 of FIG. 1C, where wafers 133, 134 are eutectically bonded. At process 230, wafer grinding is performed to remove edge portions 207, 208 of the cells of MEMS wafer 133. Then in process 235, etching is performed to remove oxide coating 209 from metal pads 211, 212 of caps wafer 134. Although not show here, bond wires at pads 211, 212 can be used to electrically communicate with the signal routing structures of polysilicon layers 103, 106. In another example, solder bumps (not shown) are formed on pads 211, 212 for electrical connection.

The MEMS device package of FIG. 2B also includes getter structure 213 on caps wafer 134. Getter structure 213 can be used in some embodiments to increase an amount of vacuum within the cavity of the MEMS device when a vacuum cavity is adopted. Getter structure 213 includes a material that is able to effectively absorb out-gassing particles inside the vacuum cavity. In one example, getter structure 213 includes titanium (Ti), bromine (Br) or zirconium (Zr). Getter structure 213 is shown on caps wafer 134, but in other embodiments a getter structure can be included on MEMS wafer 133 additionally or alternatively. The same is true for other embodiments, including the embodiment of FIG. 1C.

Methods 100 and 200 are exemplary, and it is understood that other embodiments may include processes that add, omit, rearrange, or modify some actions. For instance, some embodiments have more or fewer moveable members than that shown in FIGS. 1C and 2B. Furthermore, FIGS. 1A-B and 2B show exemplary processes for creating a structure with two signal routing layers, and it is understood that the processes shown herein may be modified to create three or more routing layers if desired. Moreover, other packaging steps, such as dicing, may be included in various embodiments. In this embodiment, various MEMS devices are simultaneously packaged at wafer level for reduced manufacturing cost and enhanced reliability. A dicing process is then applied to the packaged wafer, resulting multiple MEMS devices.

Various embodiments may include advantages over other techniques. For instance, as explained above, use of polysilicon for anti-stiction bumps decreases the amount of charge buildup in the device. Additionally, polysilicon signal routing structures can be used as etch stop structures to thereby better define the cavity which contains the moveable members. Furthermore, techniques that fusion bond a silicon wafer on top of the oxide layer before forming the cavity may benefit from increased reliability of the fusion bond.

The various embodiments shown above can be used in any of a variety of devices. For instance, MEMS devices with moveable members are especially useful in motion sensors, such as accelerometers, gyroscopes, and the like. The semiconductor devices, including the MEMS devices, may be packaged and installed in industrial and consumer applications. Examples of applications that may benefit from MEMS devices described herein include, e.g., gaming motion controllers, automotive sensors, etc. In other embodiments, the MEMS device may be deployed in an application as a stand-alone chip or on a same chip as another semiconductor device, such as a processor.

Thus, the present disclosure provide a micro-electromechanical system (MEMS) structure. The MEMS structure includes a MEMS substrate; a first and second conductive plugs of a semiconductor material disposed on the MEMS substrate, wherein the first conductive plug is configured for electrical interconnection and the second conductive plug is configured as an anti-stiction bump; a MEMS device configured on the MEMS substrate and electrically coupled with the first conductive plug; and a cap substrate bonded to the MEMS substrate such that the MEMS device is enclosed therebetween.

In one embodiment, the semiconductor material of the first and second conductive plugs is selected from the group consisting of polysilicon, silicon germanium, and combination of. In another embodiment, the MEMS structure further includes a third conductive plug of the semiconductor material disposed on the MEMS substrate and electrically coupled with the first conductive plug; a first dielectric material layer disposed on the first substrate and embedded with the third conductive plug; an etch stop layer disposed on the first dielectric material layer and including at least one of aluminum nitride (AlN), silicon carbide (SiC), low stress silicon nitride (SiN), and aluminum oxide ($Al_2O_3$); and a second dielectric material layer disposed on the etch stop layer and embedded with the first conductive plug.

In yet another embodiment, the MEMS substrate includes one of a silicon substrate, a glass substrate and a gallium arsenide (GaAs) substrate. In yet another embodiment, the cap substrate includes one of a complimentary metal-oxide-semiconductor (CMOS) substrate, a MEMS substrate and a combination thereof. In yet another embodiment, the MEMS structure further includes an interconnect structure disposed on the cap substrate, wherein the interconnect structure includes tungsten plug and metal lines. In yet another embodiment, the MEMS structure further includes a conductive line of the semiconductor material disposed on the MEMS substrate and connect to the first conductive plug. In yet another embodiment, the MEMS structure further includes a bonding feature formed on the MEMS substrate and configured to be surrounded by the first conductive plug, in which the bonding feature has a surface recessed from the first conductive plug, and the cap substrate are bonded together with the cap substrate through the bonding feature. In yet another embodiment, the MEMS substrate further includes a through via and a metal feature disposed in the through via; and the metal feature is extended through the MEMS substrate, is electrically coupled to a solder bump feature disposed on a surface of the MEMS substrate remote from the first conductive plug and is further electrically coupled to the MEMS device through the first conductive plug.

The present disclosure also provides another embodiment of a micro-electro-mechanical system (MEMS) structure. The MEMS structure includes a first substrate; a first polysilicon plug disposed on the first substrate, wherein the first polysilicon plug is configured for electrical interconnection; a MEMS device configured on the first substrate and electrically coupled with the first polysilicon plug; and a second substrate bonded to the first substrate such that the MEMS device is enclosed.

In one embodiment, the MEMS structure further includes a second polysilcion plug disposed on the first substrate and electrically coupled with the first polysilicon plug; a first dielectric material layer disposed on the first substrate and embedded with the second polysilicon plug; an etch stop layer disposed on the first dielectric material layer; a second dielectric material layer disposed on the etch stop layer and embedded with the first polysilicon plug; and a third conductive plug embedded in the second dielectric material layer, adjacent the MEMS device and configured as an anti-stiction bump. In another embodiment, the etch stop layer includes aluminum nitride. In yet another embodiment, the first polysilicon plug and the etch stop layer further functions to stop etch during an etching process to make the MEMS device. In yet another embodiment, the first substrate includes one of a silicon substrate, a glass substrate and a gallium arsenide (GaAs) substrate; and second substrate includes one of a complimentary metal-oxide-semiconductor (CMOS) substrate, a MEMS substrate and a combination thereof. In yet another embodiment, the first substrate and the second substrate are bonded together through a bonding feature configured to be surrounded by the first polysilicon plug; and the first polysilicon plug further functions as a guard ring to prevent squish issue during a bonding process to bond the first and second substrates. In yet another embodiment, the first substrate further includes a through via and a metal feature disposed in the through via; and the metal feature is extended through the first substrate, is electrically coupled to a solder bump feature disposed on a surface of the first substrate remote from the first polysilicon plug and is further electrically coupled to the MEMS device through the first polysilicon plug. In yet another embodiment, the MEMS structure further includes one of wiring bonding pad and solder bump disposed on the second substrate and coupled to the MEMS device through the first polysilcion plug The present disclosure also provides an embodiment of a method for forming a MEMS structure. The method includes forming, on a MEMS substrate, an interconnect structure having conductive lines and a first conductive plug of a semiconductor material; forming an etch stop layer on the interconnect structure; forming a dielectric layer over the etch stop layer; bonding a silicon substrate over the dielectric layer; forming a second and third conductive plugs of the semiconductor material in the silicon substrate, wherein the second conductive plug is configured to be electrically coupled with the first conductive plug and third conductive plug is configured to function as an anti-stiction bump; forming a MEMS device electrically coupled with the second conductive feature; and forming a bonding pad on the silicon substrate and surrounded by the second conductive plug.

In one embodiment of the method, the semiconductor material includes one of polysilicon and silicon germanium; and the silicon substrate includes a high resistive silicon material. In another embodiment, the method further includes bonding a cap substrate to the MEMS substrate through the bonding pad. In yet another embodiment, forming the second conductive plug further includes depositing a material layer on the silicon substrate; etching the material layer and the silicon substrate to form a through via therein; forming the second conductive plug of the semiconductor material in the through via of the material layer and the silicon substrate; and removing the material layer such that the second conductive plug extrudes out of the silicon substrate.

In yet another embodiment, forming a bonding pad includes forming the bonding pad on the silicon substrate and surrounded by the extruded portion of the second conductive plug. In yet another embodiment, forming a MEMS device includes etching the silicon substrate to expose the dielectric layer; etching the dielectric layer using the etch stop layer and the second conductive plug to stop the etching vertically and laterally. In yet another embodiment, the dielectric layer includes silicon oxide; the etch stop layer includes aluminum nitride; and etching the dielectric layer implements a hydrofluoric etchant. In yet another embodiment, the method further includes bonding a cap substrate to the MEMS substrate through the bonding pad; etching the MEMS substrate to form a through via therein; and depositing a metal layer in the through via and the MEMS substrate, forming a solder bump electrically coupled with the second conductive plug. In yet another embodiment, the method further includes dicing the MEMS substrate and the cap substrate, resulting in a plurality of MEMS devices.

The present disclosure also provides another embodiment of a method for forming a MEMS structure. The method includes forming, on a MEMS substrate, an interconnect structure having conductive lines and a first conductive plug of a semiconductor material; forming an etch stop layer on the interconnect structure; forming a dielectric layer over the etch stop layer; bonding a silicon substrate over the dielectric layer; etching the silicon substrate to form through vias therein, exposing the dielectric layer; forming a second conductive plug of the semiconductor material, electrically coupled with the first conductive plug, and configured to further function as an anti-stiction bump; etching the silicon substrate to form a MEMS device electrically coupled with the second conductive feature; forming a bonding pad on the silicon substrate and surrounded by the second conductive plug; bonding a cap substrate to the MEMS substrate through the bonding pad; etching the MEMS substrate to form through via therein; and depositing a metal layer in the through via and the MEMS substrate, resulting a solder bump electrically coupled with the second conductive bump.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming a MEMS structure, the method comprising:

forming, on a MEMS substrate, an interconnect structure having conductive lines and a first conductive plug of a semiconductor material;

forming an etch stop layer on the interconnect structure;

patterning the etch stop layer to form an opening therein;

forming a patterned layer that comprises a signal routing structure, wherein the signal routing structure fills the opening and is electrically coupled with the first conductive plug via the filled opening;

forming, by deposition, a dielectric layer over the etch stop layer and the patterned layer;

bonding a silicon substrate over the dielectric layer;

forming second and third conductive plugs of the semiconductor material in the silicon substrate, wherein the second conductive plug is configured to be electrically coupled with the first conductive plug and the third conductive plug is configured to function as an anti-stiction bump, wherein forming the second conductive plug comprises, after the patterning of the etch stop layer, etching the silicon substrate to create a through via therein that is then filled by the second conductive plug;

forming a MEMS device electrically coupled with the second conductive plug; and forming a bonding pad on the silicon substrate and surrounded by the second conductive plug.

2. The method of claim 1, wherein forming the MEMS device comprises etching portions of the dielectric layer to form a cavity, and wherein the semiconductor material includes one of polysilicon and silicon germanium; and the silicon substrate is fusion bonded to the dielectric layer before formation of the cavity.

3. The method of claim 1, further comprising bonding a cap substrate to the MEMS substrate through the bonding pad.

4. The method of claim 1, wherein forming the second conductive plug further includes depositing a material layer on the silicon substrate;

etching the material layer and the silicon substrate to form the through via therein;

forming the second conductive plug of the semiconductor material in the through via of the material layer and the silicon substrate; and removing the material layer such that the second conductive plug extrudes out of the silicon substrate.

5. The method of claim 4, wherein the bonding pad is surrounded by the extruded portion of the second conductive plug.

6. The method of claim 1, further comprising bonding a cap substrate to the MEMS substrate through the bonding pad;

etching the MEMS substrate to form a second through via therein; and depositing a metal layer in the second through via and the MEMS substrate, forming a solder bump electrically coupled with the second conductive plug.

7. A method for forming a micro-electro-mechanical system (MEMS) structure, the method comprising:

disposing a first dielectric material layer on a MEMS substrate;

disposing an etch stop layer on the first dielectric material layer;

patterning the etch stop layer to form an opening therein;

depositing a second dielectric material layer on the etch stop layer;

bonding a silicon layer to the second dielectric material layer;

embedding a first conductive plug in the silicon layer, wherein the first conductive plug comprises a semiconductor material and is configured for electrical interconnection, wherein the first conductive plug is electrically coupled with another plug that fills the opening in the etch stop layer, wherein forming the first conductive plug comprises, after the patterning of the etch stop layer, etching the silicon substrate to create a through via therein that is then filled by the first conductive plug;

embedding a second conductive plug in the silicon layer, wherein the second conductive plug comprises a semiconductor material and is configured as an anti-stiction bump;

forming a MEMS device on the MEMS substrate, the MEMS device being electrically coupled with the first conductive plug; and bonding a cap substrate to the MEMS substrate such that the MEMS device is enclosed therebetween.

8. The method of claim 7, wherein the semiconductor material of the first and second conductive plugs is selected from the group consisting of polysilicon, silicon germanium, and combination of.

9. The method of claim 7, further comprising disposing a third conductive plug of the semiconductor material on the MEMS substrate, the third conductive plug being electrically coupled with the first conductive plug, wherein the first dielectric material layer is embedded with the third conductive plug, wherein the etch stop layer includes at least one of aluminum nitride (AlN), silicon carbide (SiC), low stress silicon nitride (SiN), and aluminum oxide ($Al_2O_3$), and wherein the second dielectric material layer is embedded with the first conductive plug.

10. The method of claim 7, wherein the MEMS substrate includes one of a silicon substrate, a glass substrate and a gallium arsenide (GaAs) substrate.

11. The method of claim 7, wherein the cap substrate includes one of a complementary metal-oxide-semiconductor (CMOS) substrate, a second MEMS substrate, and a combination thereof.

12. The method of claim 7, further comprising disposing an interconnect structure on the cap substrate, wherein the interconnect structure includes a tungsten plug and metal lines.

13. The method of claim 7, further comprising, forming a bonding feature on the MEMS substrate, the bonding feature being surrounded by the first conductive plug, wherein the bonding feature has a surface recessed from the first conductive plug, and wherein the MEMS substrate are bonded together with the cap substrate through the bonding feature.

14. The method of claim 7, further comprising, forming a second through via with a metal feature disposed therein, wherein the metal feature is extended through the MEMS substrate, is electrically coupled to a solder bump feature disposed on a surface of the MEMS substrate remote from the first conductive plug and is further electrically coupled to the MEMS device through the first conductive plug.

15. A method for forming a micro-electro-mechanical system (MEMS) structure, the method comprising:

forming a first dielectric material layer on a first substrate;

forming an etch stop layer on the first dielectric material layer;

patterning the etch stop layer to form an opening therein;

forming, by deposition, a second dielectric material layer on the etch stop layer;

bonding a silicon layer to the second dielectric material layer;

forming a first polysilicon plug extending through the silicon layer, wherein the first polysilicon plug is configured for electrical interconnection, wherein the first polysilicon plug is electrically coupled with another plug that fills the opening in the etch stop layer, wherein forming the first polysilicon plug comprises, after the patterning of the etch stop layer, etching the silicon layer to create a through via therein that is then filled by the first polysilicon plug;

forming a MEMS device on the first substrate, the MEMS device being electrically coupled with the first polysilicon plug; and bonding a second substrate to the first substrate such that the MEMS device is enclosed.

16. The method of claim 15, further comprising
disposing a second polysilicon plug on the first substrate, the second polysilicon plug being electrically coupled with the first polysilicon plug, the first dielectric material layer being embedded with the second polysilicon plug, the second dielectric material layer being embedded with the first polysilicon plug; and embedding a third conductive plug in the second dielectric material layer, adjacent the MEMS device and configured as an anti-stiction bump.

17. The method of claim 15, further comprising, using the first polysilicon plug and the etch stop layer to stop etch during an etching process to make the MEMS device.

18. The method of claim 15, wherein:
the first substrate includes one of a silicon substrate, a glass substrate and a gallium arsenide (GaAs) substrate; and second substrate includes one of a complimentary metal-oxide-semiconductor (CMOS) substrate, a second MEMS substrate, and a combination thereof.

19. The method of claim 15, wherein bonding the second substrate to the first substrate comprises using a bonding feature that is surrounded by the first polysilicon plug, wherein the bonding feature has a surface recessed from the first polysilicon plug.

20. The method of claim 15, further comprising, forming one of: a wiring bonding pad and a solder bump on the second substrate so as to be coupled to the MEMS device through the first polysilicon plug.

* * * * *